(12) United States Patent
Hopper et al.

(10) Patent No.: US 7,202,538 B1
(45) Date of Patent: Apr. 10, 2007

(54) ULTRA LOW LEAKAGE MOSFET TRANSISTOR

(75) Inventors: Peter J. Hopper, San Jose, CA (US); Philipp Lindorfer, San Jose, CA (US); Vladislav Vashchenko, Palo Alto, CA (US); Robert Drury, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/647,604

(22) Filed: Aug. 25, 2003

(51) Int. Cl.
*H01L 29/94* (2006.01)
(52) U.S. Cl. .................. 257/374; 257/297; 257/446
(58) Field of Classification Search .............. 257/355, 257/368, 446, 501, 506
See application file for complete search history.

(56) References Cited

U.S. PATENT DOCUMENTS 6,121,657 A * 9/2000 Yama .................. 257/341
6,611,027 B2 * 8/2003 Ichikawa ............... 257/355
2003/0001196 A1 * 1/2003 Choi et al. .............. 257/315
2003/0006463 A1 * 1/2003 Ichikawa ............... 257/355

FOREIGN PATENT DOCUMENTS

JP 62123736 A * 6/1987

* cited by examiner

*Primary Examiner*—Johannes Mondt
(74) *Attorney, Agent, or Firm*—Stallman & Pollock LLP

(57) ABSTRACT

A MOSFET transistor structure is formed in a substrate of semiconductor material having a first conductivity type. The MOSFET transistor structure includes an active region that is surrounded by a perimeter isolation dielectric material formed in the substrate to define a continuous sidewall interface between the sidewall dielectric material and the active region. Spaced-apart source and drain regions are formed in the active region and are also spaced-apart from the sidewall interface. A conductive gate electrode that is separated from the substrate channel region by intervening gate dielectric material includes a first portion that extends over the substrate channel region and a second portion that extends continuously over the entire sidewall interface between the isolation dielectric material and the active region. Thus, an enclosed ring is maintained around the entire composite perimeter, thereby completely avoiding regions of high trap density and, thus, preventing any current path for gate induced drain leakage (GIDL) to occur.

10 Claims, 6 Drawing Sheets

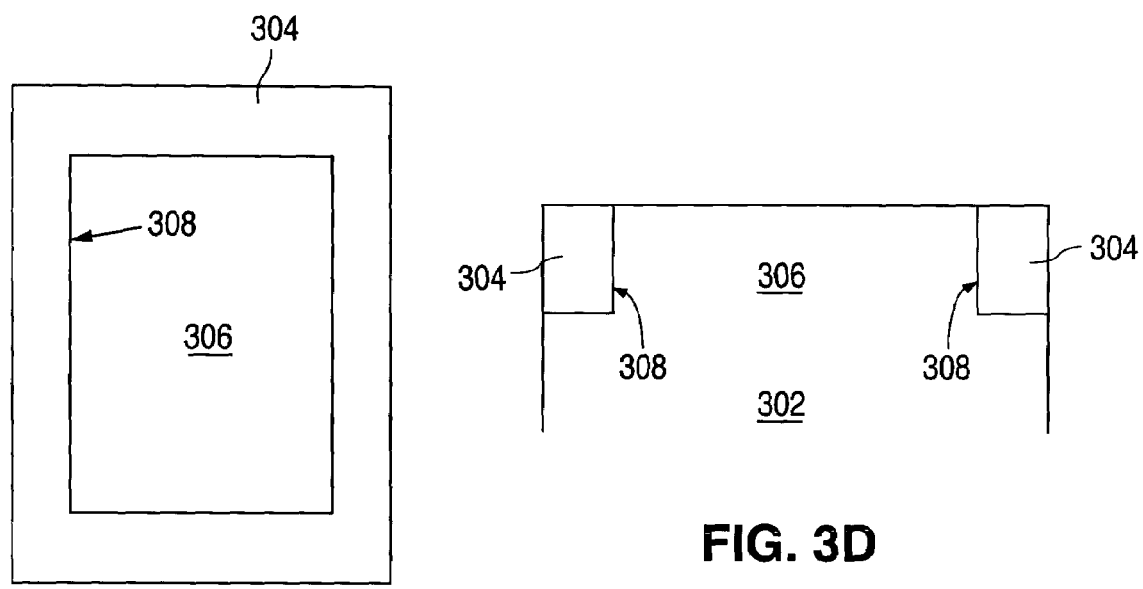
FIG. 3C
FIG. 3D
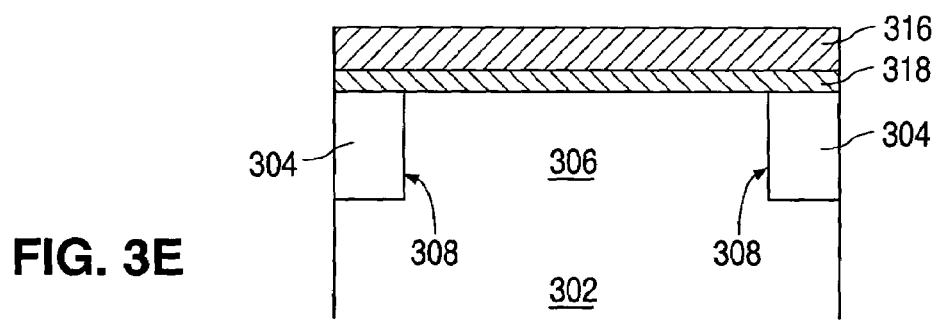
FIG. 3E
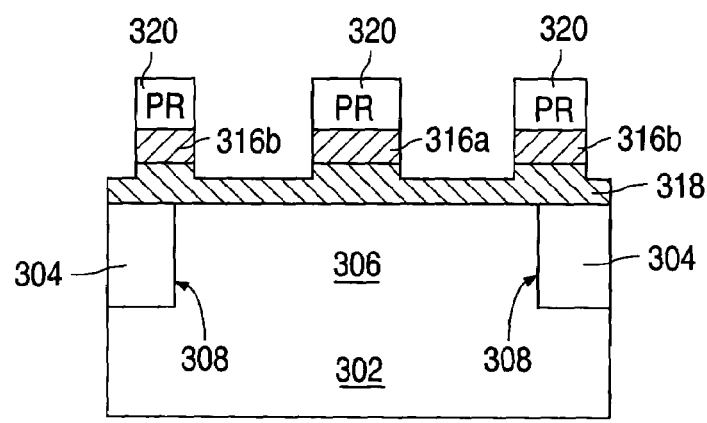
FIG. 3F

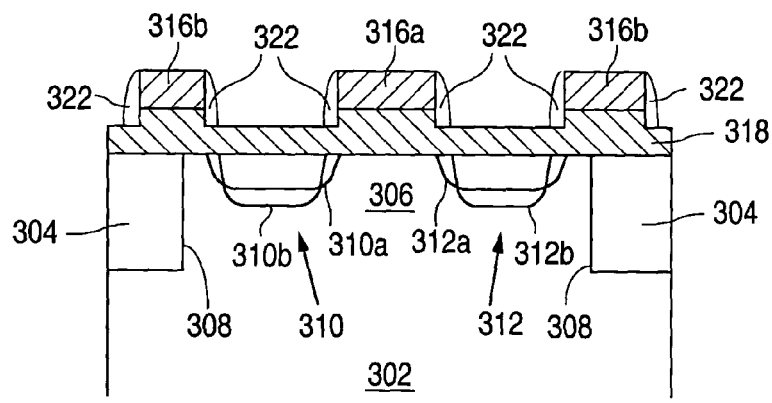
FIG. 3G
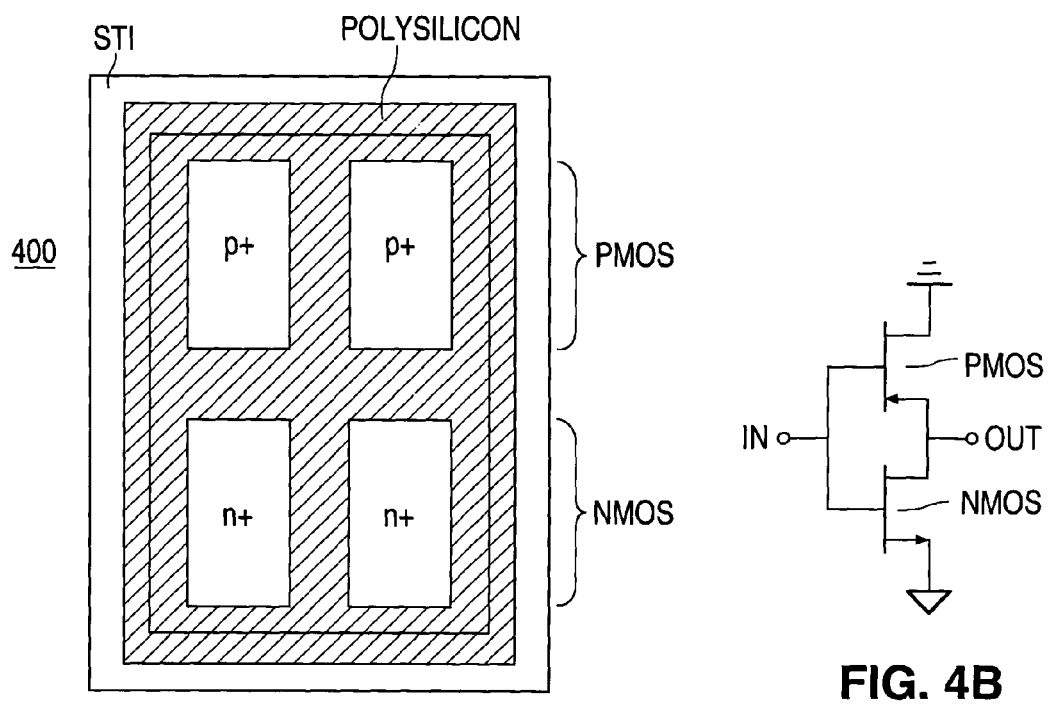
FIG. 4A   FIG. 4B

ULTRA LOW LEAKAGE MOSFET TRANSISTOR

TECHNICAL FIELD

The present invention relates to a design for an ultra low leakage MOSFET transistor that is formed by minimizing band-to-band and trap assisted tunneling mechanisms leading to gate induced drain leakage characteristics.

BACKGROUND OF THE INVENTION

MOSFET transistors are widely used in semiconductor circuits. FIGS. 1A and 1B show a conventional MOSFET transistor structure. FIG. 1A shows a top view of the MOSFET transistor 100; FIG. 1B shows a side view taken along line A–A'. Spaced-apart n-type source region 110 and n-type drain region 112 formed in p-type semiconductor substrate 114 define a substrate channel region 116. A drain contact 106 and a source contact 108 are also provided. A conductive gate electrode 104 is disposed over the channel 116, with a gate oxide layer 120 disposed between the gate 104 and the channel 116.

Depending upon a voltage applied to the gate 104, the channel 116 can be made to become conductive or nonconductive. When the channel is conductive, a voltage applied across the drain contact 106 and the source contact 108 results in electrons flowing from the source 110 to the drain 112. [The amount of current flowing between the source 110 and drain 112 is proportional to the amount of resistance of the channel region 116.] As shown in FIGS. 1A and 1B, the structure of a conventional MOSFET is such that the length (Lc1) of the gate 104 is constant across the area separating the source 110 and drain 112.

Since the process used to fabricate a MOSFET structure is well known, the entire process is not described in detail herein; relevant aspects of the process are provided. For an N-channel MOSFET, a P type silicon substrate 114 is used. The region of the substrate 114 in which the MOSFET is formed can be isolated using shallow trench isolation techniques (STI), or other isolation processes such a local oxidation of silicon (LOCOS) process. In the STI process, for example, a photoresist mask can be formed over the substrate 114 and trench is etched into the surface of the substrate 114. The trench is then filled with an insulating material such as $SiO_2$. The resulting isolation region 102 is shown in FIGS. 1A and 1B. The isolation region 102 operates to isolate the MOSFET structure from other devices formed in an integrated circuit. The isolation region 102 forms a sidewall along the source 110, drain 112 and on both ends of the channel 104. This sidewall area has discontinuities, or traps, in the structure of the silicon substrate 114, which are due to stresses on the substrate resulting from the process used to form the sidewall of the isolation area 102.

As shown in FIG. 1B, an insulating layer 120 is disposed on top of the substrate 114. The gate 104, which can be formed of polysilicon, or other suitable conductive material, is formed on top of the insulating layer 120. For NMOS devices, typically after the gate 104 has been formed, N type atoms, such as Arsenic, are implanted into the substrate 114 to form the source region 110 and drain region 112 and to dope the gate polysilicon. The area under the gate 104 then forms the channel 116. Thus, the channel region 116 provides a uniform distance (Lc1) separating the source 110 from the drain 112.

As shown in FIG. 1A, current 118 flowing between the drain 112 and source 110 results when a voltage differential is applied across the drain contact 106 and the source contact 108 and an appropriate voltage has also been applied to the gate 104. Given that the length Lc1 of the channel 116 separating the source 110 from the drain 112 is constant across the width of the device, the resistance across the width of the device is uniform.

Electrons moving through the channel 116 between the source 110 and drain 112 which are in close proximity to the sidewall with the isolation region 102 will tend to have their movement impeded by the traps that result from the formation of the trench. This results in the generation of low frequency noise, some times referred to as 1/f noise. The channel region 116 includes two principal 1/f noise sources: those originating from the stress induced along the isolation sidewall and those originating from the silicon dioxide to silicon interface under the poly. The larger the amount of current flowing along edge of the channel region 116 that is adjacent to the sidewall of the isolation region 102, the greater the noise generated.

Co-pending and commonly-assigned U.S. patent application Ser. No. 10/423,065, filed on Apr. 25, 2003, discloses the MOSFET structure 200 shown in FIGS. 2A–E. As shown therein, a drain region 212 is provided having a drain contact 206. The MOSFET 200 also includes a source region 210 and having a source contact 208. A channel region 216 is disposed between the source 210 and drain 212. A gate 204 is disposed above the channel region 216 and is separated from the channel 216 by a gate oxide layer 220. However, unlike in the MOSFET structure discussed above with respect to FIGS. 1A and 1B, the length of the gate 204 is not the same across the width of the MOSFET 200.

As shown in FIG. 2A, the area of the gate 204 shown as having a width of W2 corresponds to the area over the isolation area sidewall 201 and over the area of the channel 216 that is adjacent to the sidewall 201. This area has a width of W2 and a length of L2. As further shown in FIG. 2A, a second area of the gate 204 is above a region where the channel 216 is adjacent to the sidewall 205 of the isolation area 202. In this area above the region of the sidewall 205, the gate 204 has a width shown as W3 and a length of L2. In between the areas of the gate 204 which are above the sidewalls 201 and 205, another area of the gate is provided which has a width of W1 and a length of L1.

The process used to form the MOSFET 200 is very similar to that described above in connection with conventional MOSFETs. The difference is in the shape of the gate 204 of the MOSFET 200. Further, given that the shape of gate 204 is different, the channel region 216 is also of a different shape than the prior MOSFET channel regions. The process used to form the drain 212 and source 210 regions is a self-aligned process wherein atoms are implanted into the substrate 214 to form the source 210 and drain 212. The gate 204 is formed above the substrate 214 prior to implanting the atoms that form the source 210 and drain 212. Thus, when the atoms are implanted to form the drain 212 and the source 210, the material of the gate 204, which can be polysilicon or other conductive material, operates to prevent the atoms from entering the substrate 214 region underlying the gate, and this region forms the channel 216.

As shown in FIG. 2A, the area of the gate 204 having a width shown as W2 has a length of L2, which is substantially greater than the length of the gate in the area of the gate 204 where the width of the gate is W1 and the length is L1. Correspondingly, the channel region 216 under the area of the gate 204 having a width of W2 has a length L2, which is much longer than the length L1 in the area where the width of the gate 204 is W1. Further, the area of the gate 204 where the width is W3 has a length of L2.

FIG. 2B shows a cross section of the MOSFET 200 taken along cutaway lines 2B–2B' in FIG. 2A. This cross section view shows the isolation areas 202 disposed on either side of the MOSFET drain 212, source 210 and channel 216. Specifically, the sidewall 201 of the isolation area 202 is adjacent to one end of the channel 216, where the end of the channel 216 adjacent to the sidewall 201 has a width of W1; and the sidewall 205 of the isolation area 202 is adjacent to the other end of the channel 216, where the end of the channel adjacent 216 to the sidewall 205 has a width of W3. As shown along cross section 2B–2B', an area of the source 210 is between areas of the channel 216. Further, the gate 204 is disposed over the channel 216. To further illustrate the structure of the MOSFET, FIG. 2C shows a cross sectional view of the MOSFET 200 along cutaway lines 2C–2C' in FIG. 2B. As shown along the center of the MOSFET 200, the channel 216 is continuous between sidewall 201 of the isolation area 202 and sidewall 205. The gate 204 is disposed over the channel 216.

FIG. 2D shows a cross sectional view of the MOSFET 200 along cutaway lines 2D–2D' in FIG. 2A. As shown in FIG. 2D, the drain 212 is separated from the source 210 by the channel 216. The channel 216 in the area shown has a length of L2. The width of the channel 216 and the gate 204 in this area is W3.

FIG. 2E shows a cross section view of the MOSFET 200 along cutaway lines 2E–2E' in FIG. 2A. As shown in FIG. 2E, the drain 212 is separated from the source 210 by the channel 216. The channel along the line 2E–2E' has a length of L1.

The operation of the MOSFET 200 is similar to that discussed above with respect to the prior MOSFET 100. However, the different shape of the gate 204 and channel 216 in the MOSFET 200 result in beneficial characteristics. To consider the operation of the MOSFET 200, it is helpful to recognize the MOSFET 200 as having 3 parts. One part corresponds to the drain 212, the channel 216 and the source 210 where the channel has a width of W2 and a length of the L2. In this area, in response to voltage being applied to the gate 204, the channel 216 will transport electrons when a voltage differential is applied across the drain contact 206 and the source contact 208. The amount of current flowing through the channel is proportional to the dimensions of the channel 216. The current flowing through the channel 216 in this area along the sidewall 201 of the isolation area 202 is proportional to W2/L2. The current flowing through center area of the channel 216 having a width W1 is proportional to W1/L1. The current flowing through the channel 216 in the area along the sidewall 205 of the isolation area 202 is proportional to W3/L2. By providing a gate 204, and underlying channel 216 shaped to increase the amount of current flowing through a center part of the channel 214 and to decrease the amount of current flowing in an area along the sidewalls 201 and 205 of the isolation area 202, the amount of noise generated by current flowing through the MOSFET 200 is minimized. As discussed above, the stresses to the underlying substrate 214 induced by the forming of the sidewall 201 and 205 of the isolation area 202 create discontinuities or traps which interfere with the movement of electrons through the channel 216 in the areas proximate to the sidewalls 201 and 205. This results in noise (1/f noise). The amount of noise is proportional to the amount of current flowing along the sidewall.

MOSFET leakage is derived from a series of physical mechanisms. To design a low leakage transistor, each of these mechanisms should be minimized. Typically, and primarily, CMOS device leakage mechanisms are dominated by drain induced barrier lowering (DIBL) and by gate induced drain leakage (GIDL). DIBL may be simply minimized by minimizing short channel effects, enlarging channel lengths and raising channel dopant concentrations. Once DIBL is minimized to below a picoamp per micro width, leakage is typically governed by the level of GIDL.

GIDL is associated with a tunneling mechanism and, in turn, is dominated by trap assisted tunneling. Thus, if the level of traps associated with the semiconductor region under the direct influence of a gate-drain Efield, then the level of GIDL leakage will be lowered and, in turn, provide the path to a low leakage transistor.

BRIEF DESCRIPTION OF THE DRAWINGS

FIGS. 3A–3G show views of an embodiment of a MOSFET transistor structure in accordance with the present invention.

FIG. 4A shows a layout of a CMOS transistor structure that utilizes the concepts of the present invention.

FIG. 4B is a schematic diagram illustrating a CMOS circuit corresponding to the FIG. 4A structure.

DETAILED DESCRIPTION

Figure 3A:
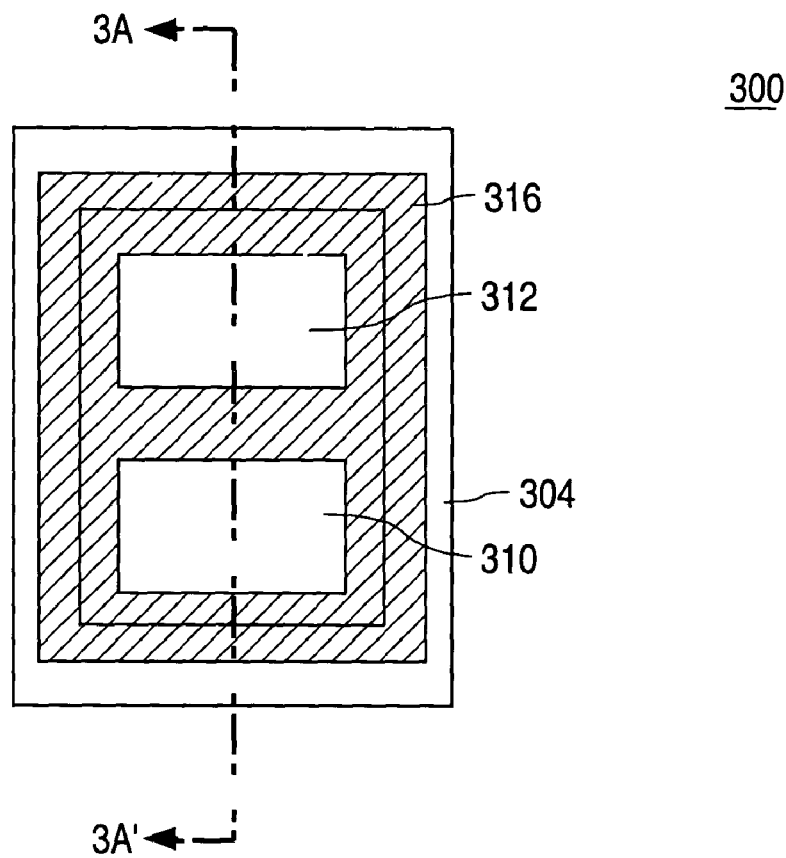
Figure 3B:
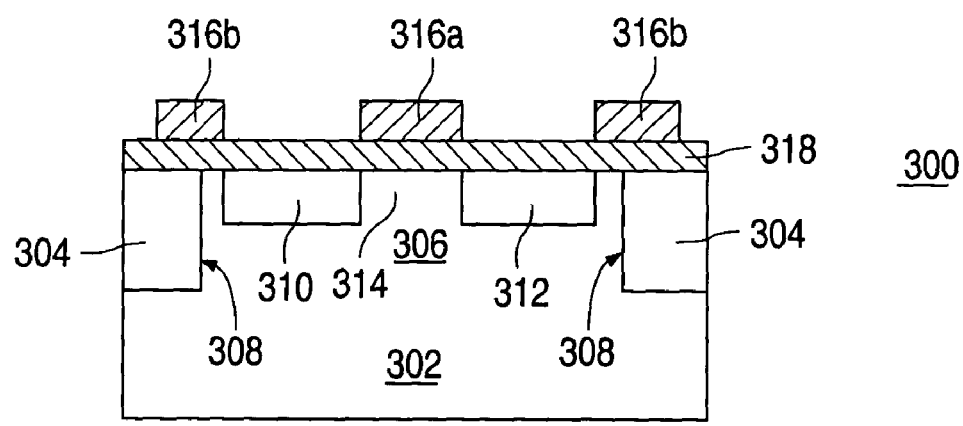

FIGS. 3A and 3B show a MOSFET transistor structure 300 in accordance with the concepts of the present invention. Although the transistor structure 300 is described in the context of an NMOS device, those skilled in the art will appreciate that the concepts of the invention are equally applicable to PMOS devices.

The transistor structure 300 is formed in a substrate of semiconductor material 302, preferably silicon, having a first conductivity type. Perimeter isolation dielectric material 304, which preferably is shallow trench isolation (STI) silicon dioxide, but can be LOCOS (local oxidation of silicon) or other types of conventional isolation structures, is formed in the substrate 302 along the entire perimeter of an active region 306 to define a continuous sidewall interface 308 between the isolation dielectric material 304 and the active region 306. Spaced-apart source and drain regions 310, 312 having a second conductivity type that is opposite the first conductivity type are formed in the active region 306 to define a substrate channel region 314 therebetween. (As discussed in greater detail below, both the source region 310 and the drain region 312 preferably include a low density diffusion (LDD) region and deep implant region). As further shown in FIGS. 3A and 3B, both the source region 310 and the drain region 312 are also spaced-apart from the isolation dielectric material 304. A conductive gate electrode 316 that includes a first portion 316a that extends over the substrate channel region 314 and a second portion 316b that extends continuously over the entire sidewall interface 308 between the isolation dielectric material 304 and the active device region 306 is separated from the active region 306 by intervening gate dielectric material 318.

The MOSFET transistor structure shown in FIGS. 3A and 3B can be formed in accordance with the following integrated circuit manufacturing process steps illustrated in FIGS. 3C–3G.

First, as shown in FIGS. 3C and 3D, isolation dielectric material 304, shown in this example as STI, is formed in the semiconductor substrate 302 (e.g. silicon) such that the isolation dielectric material 304 defines an active region 306 of the substrate 302. The isolation material 304 is formed along the entire perimeter of the active region 306 to define a continuous sidewall interface 308 between the isolation dielectric material 304 and the active region 306.

As shown in FIG. 3E, a layer of gate dielectric material 318, e.g. silicon dioxide, is then formed to extend over the active region 306 and over the continuous sidewall interface 308 between the isolation dielectric material 304 and the active region 302. A layer of conductive material 316, e.g. polysilicon, is then formed over the gate dielectric material 318.

As shown in FIG. 3F, a mask 320, typically photoresist, is then formed over the conductive gate material 316 and patterned to define the source and drain openings. The mask 320 is then utilized to etch the layer of conductive gate material 316 to provide a first "channel" portion 316a of the conductive gate 316 and a second "perimeter" portion 316b of the conductive gate 316. As further shown in FIG. 3F, this etch process can result in etching of exposed regions of the gate dielectric material 318.

Referring to FIG. 3G, following the patterning of the conductive gate material 316 to define the first portion 316a and the second portion 316b as discussed above, a low density diffusion (LDD) step is performed to introduce dopant material having a second conductivity type into the source region 310 to provide source LDD region 310a and into drain region 312 to provide drain LDD region 312a. Following the LDD step, a layer of silicon oxide is formed and then anisotropically etched to proved oxide spacers 322 on the sidewalls of the conductive gate 316. A second, deeper implant of dopant material of the second conductivity type is then performed to provide the deep source region 310b and the deep drain region 312b. Since the implant of the LDD regions 310a, 312a is self-aligned to the conductive gate 316, which extends over the sidewall interface 308 into the active region 306 along the entire perimeter of the active region 306, and the deep implant is self-aligned to the sidewall spacers 322, both the source region 310 and the drain region 312 are spaced-apart from the sidewall interface 308 between the isolation dielectric material 304 and the active region 306.

The MOSFET structure is then completed utilizing well-known processing steps.

Figure 1A:
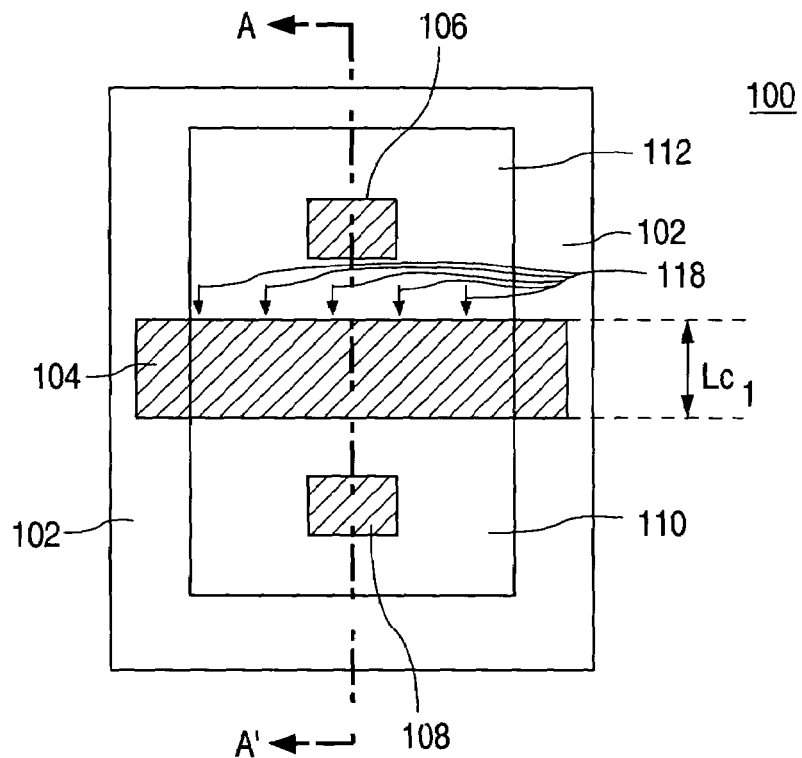
FIGS. 1A–1B show views of a conventional MOSFET transistor structure.
Figure 1B:
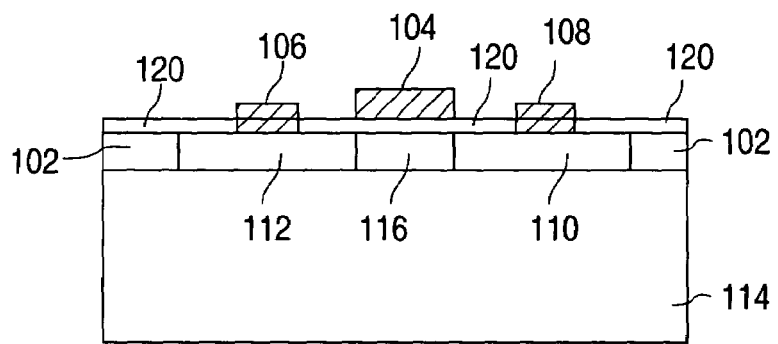
Figure 2A:
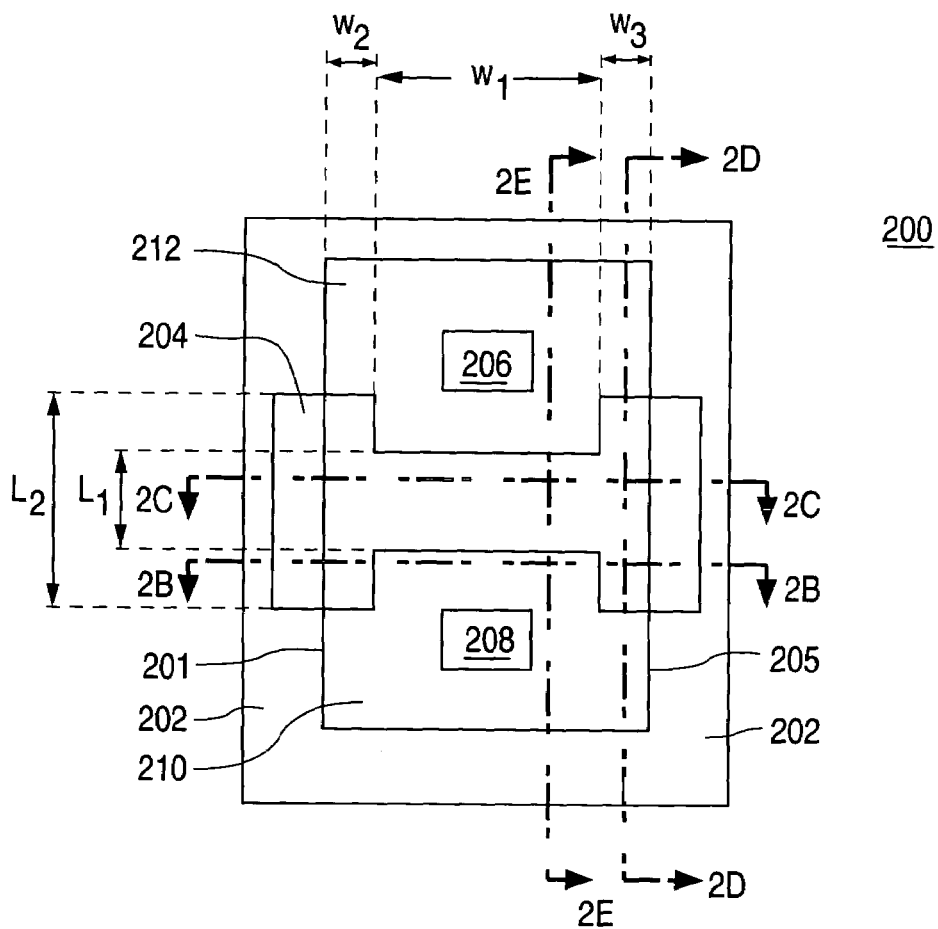
FIGS. 2A–2E show views of an alternate MOSFET transistor structure.
Figure 2B:
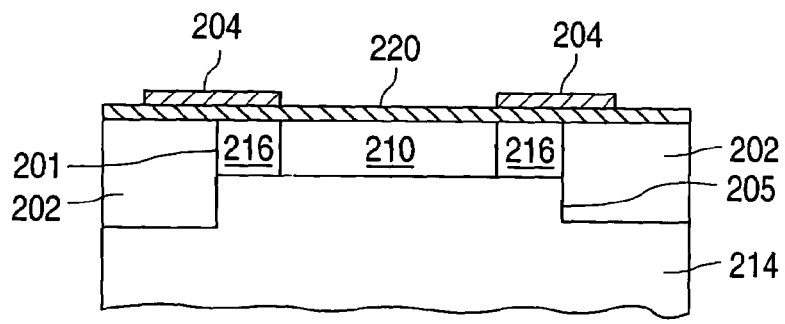
Figure 2C:
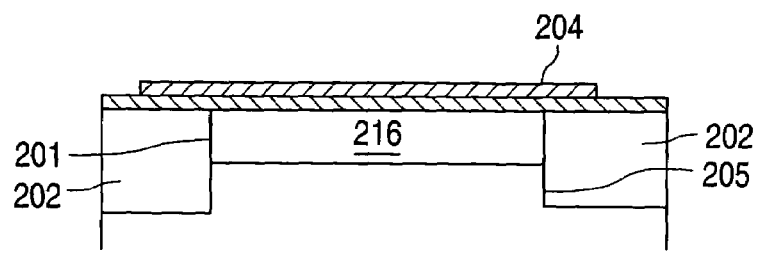
Figure 2D:
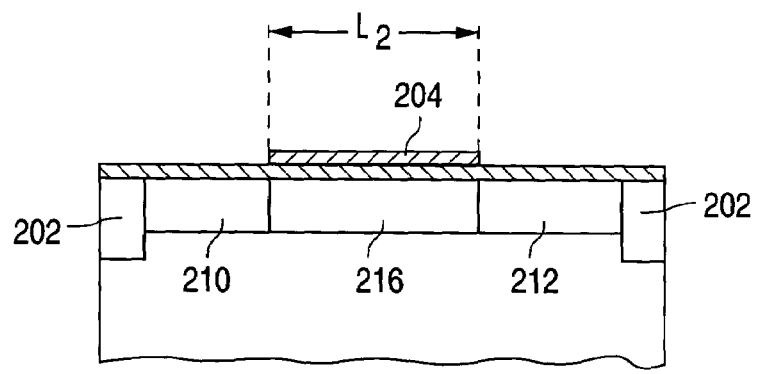
Figure 2E:
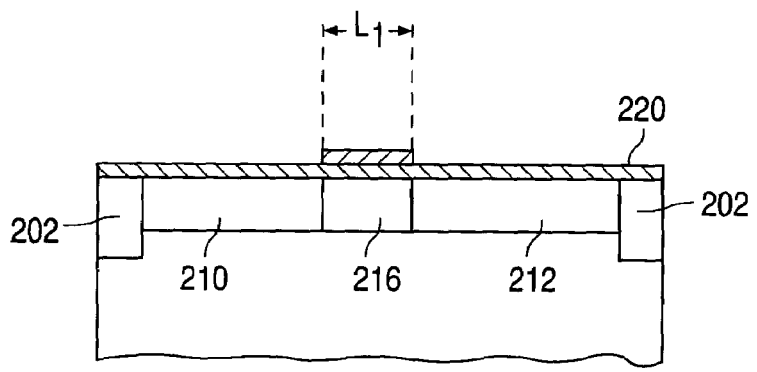

Thus, a new form of MOSFET transistor structure is provided for use with either local or trench or other isolation schemes. Instead of the gate polysilicon being drawn across an active region, as is typical in CMOS devices as shown in FIGS. 1A and 1B, or as has been proposed as a low 1/f noise MOSFET of the type shown in FIGS. 2A and 2B, an enclosure ring is maintained around the entire composite perimeter, thereby completely avoiding the regions of high trap density and, thus, preventing any current path for the GIDL mechanism to take place.

The premise for this proposal is based upon the fact that a higher density of traps is associated with the perimeter of an active region. This is due to the perimeter's association with stress induced crystal slippage, crystal strain, silicon/silicon dioxide interfacial traps, intrinsic gettering properties for glsile defects, oxidation induced precipitates and even dislocations.

Further, it should be noted that the GIDL mechanism is not one associated with source to drain leakage.

Since process variations and differences in device architecture can result in differing trap densities along the sidewall interface between the isolation material and the device active region, those skilled in the art will appreciate that the width of the enclosure ring provided between the isolation sidewall and the source and drain diffusion regions in a MOSFET structure in accordance with the present invention will vary depending upon the application. For those devices, e.g. imaging devices, that are particularly sensitive to the GIDL mechanism, it is believed that the width of the enclosure ring should be about 1000–5000 Angstroms.

FIG. 4A shows the application of the concepts of the present invention to a CMOS transistor structure 400 that includes a PMOS device and an NMOS device. Those skilled in the art will appreciate that the NMOS device is formed in a p-type silicon substrate, while the PMOS device is formed in an n-well formed in the p-type substrate. As shown in FIG. 4A, isolation oxide (STI) formed in a silicon substrate defines the active device region of the CMOS structure 400. Spaced-apart p+ source and drain regions 402, 404 and intervening n+ channel region define the PMOS device. Spaced-apart n+ source and drain regions 406, 408 and intervening p+ channel define the NMOS device. Continuous polysilicon gate 410 provides the gate electrode for both the PMOS device and the NMOS device as well as a perimeter portion that overlaps the sidewall interface between the STI and the active device region to ensure a self-aligned source/drain implant that maintains an enclosure ring around the entire composite to prevent a GIDL current path. (FIG. 4B provides a simple CMOS circuit schematic.)

Although only specific embodiments of the present invention are shown and described herein, the invention is not to be limited by these embodiments. Rather, the scope of the invention is to be defined by these descriptions taken together with the attached claims and their equivalents.

What is claimed is:

1. A MOSFET transistor structure formed in a substrate of semiconductor material having a first conductivity type; the MOSFET transistor structure consisting of:

a single rectangular active region formed in the substrate, the single rectangular active region having a substantially rectangular perimeter;

perimeter isolation dielectric material formed in the substrate along the entire substantially rectangular perimeter of the single active region to define a continuous substantially rectangular interface between the isolation dielectric material and the single rectangular active region;

a single, contiguous source region and a single, contiguous drain region formed in the single rectangular active region to define a substrate channel region therebetween, both the single source region and the single drain region having a second conductivity type that is opposite the first conductivity type and also being spaced-apart to define a substantially rectangular substrate channel region therebetween, the substrate channel region having the first conductivity type; and a conductive gate electrode that consists of a first portion that extends over the substantially rectangular substrate channel region and a second portion that extends continuously over the entire substantially rectangular interface between the isolation dielectric material and the single rectangular active region, the conductive gate electrode being separated from the substantially rectangular substrate channel region by intervening gate dielectric material, the conductive gate electrode having one opening formed therethrough over the source region and a second opening formed therethrough over the drain region.

2. A MOSFET transistor structure as in claim 1, and wherein the perimeter isolation dielectric material comprises silicon dioxide.

3. A MOSFET transistor structure as in claim 1, and wherein the conductive gate electrode comprises polysilicon.

4. A MOSFET transistor structure as in claim 1, and wherein the gate dielectric material comprises silicon dioxide.

5. A MOSFET transistor structure as in claim 1, and wherein the first conductivity type is P-type.

6. A MOSFET transistor structure as in claim 1, and wherein both the single source region and the single drain region are spaced-apart from the substantially rectangular interface.

7. A MOSFET transistor structure as in claim 6, and wherein both the single source region and the single drain region are spaced-apart from the substantially rectangular interface by about 1000–5000 Angstroms.

8. A method of forming a MOSFET transistor structure in a substrate of semiconductor material having a first conductivity type, the method comprising:

forming isolation dielectric material in the substrate such that the isolation dielectric material defines a substantially rectangular active region of the substrate, the isolation dielectric material being formed along the entire perimeter of the active region to define a continuous substantially rectangular sidewall interface between the isolation dielectric material and the active region;

forming a layer of gate dielectric material that extends over the active region and over the continuous sidewall interface between the isolation dielectric material and the active region;

introducing dopant material into the active region to define one single, contiguous source region and one single, contiguous drain region that is space-apart from the source region, the source region and the drain region having a second conductivity type that is opposite the first conductivity type and defining a substrate channel region therebetween; and forming a conductive gate electrode on the gate dielectric material, the conductive gate electrode consisting of a first portion that extends over the substrate channel region and a second portion that extends continuously over the entire sidewall interface between the isolation dielectric material and the active region, the conductive gate electrode being separated from the substrate channel region by intervening dielectric material, the conductive gate electrode further having a first opening formed therethrough over the source region and a second opening formed therethrough over the drain region.

9. A method as in claim 8, and wherein both the source region and the drain region are formed to be space-apart from the sidewall interface.

10. A method as in claim 9, and wherein both the source region and the drain region are formed to be spaced apart from the sidewall interface by about 1000–5000 Angstroms.

* * * * *